United States Patent [19]

Hauzer et al.

[11] Patent Number: 5,306,407
[45] Date of Patent: Apr. 26, 1994

[54] METHOD AND APPARATUS FOR COATING SUBSTRATES

[75] Inventors: Franciscus J. M. Hauzer; Wolf-Dieter Munz; Hans Veltrop, all of Venlo, Netherlands; Harald Wesemeyer, deceased, late of Hanger-Varnamo; Beate Wesemeyer, heiress, Kleinfischbach, both of Sweden

[73] Assignee: Hauzer Holding BV, AF Venlo, Netherlands

[21] Appl. No.: 654,626

[22] PCT Filed: Jun. 27, 1990

[86] PCT No.: PCT/EP90/01032
§ 371 Date: Jul. 29, 1992
§ 102(e) Date: Jul. 29, 1992

[87] PCT Pub. No.: WO91/00374
PCT Pub. Date: Jan. 10, 1991

[30] Foreign Application Priority Data

Jun. 27, 1989 [EP] European Pat. Off. ........ 89111705.3
Dec. 19, 1989 [DE] Fed. Rep. of Germany ....... 3941918

[51] Int. Cl.⁵ .................... C23C 14/32; C23C 14/34; C23C 14/48

[52] U.S. Cl. .................... 204/192.38; 204/192.16; 204/192.3; 204/298.41; 427/530; 427/580

[58] Field of Search ............ 204/192.38, 298.41, 204/192.16, 192.3; 427/580, 523, 524, 530

[56] References Cited

U.S. PATENT DOCUMENTS

| | | | |
|---|---|---|---|
| 4,877,505 | 10/1989 | Bergmann | 204/192.38 |
| 5,037,517 | 8/1991 | Randhawa | 204/192.15 |
| 5,160,595 | 11/1992 | Hauzer et al. | 204/192.38 |
| 5,234,561 | 8/1993 | Randhawa et al. | 204/192.38 |

FOREIGN PATENT DOCUMENTS

2-34775 2/1990 Japan .............................. 204/298.14

Primary Examiner—Aaron Weisstuch
Attorney, Agent, or Firm—Townsend and Townsend Khourie and Crew

[57] ABSTRACT

A method and an apparatus for coating substrates is described in which the layer to be applied is produced by the condensing particles of a plasma generated by a gas discharge which are incident on the substrates. Both an arc discharge vaporization coating process and a cathode sputtering coating process are effected in the same apparatus, and the arc discharge vaporization process is carried out before the cathode sputtering process.

28 Claims, 9 Drawing Sheets

METHOD AND APPARATUS FOR COATING SUBSTRATES

METHOD AND APPARATUS OF COATING SUBSTRATES

1. Field of the Invention

The invention relates to a method of coating substrates in which the layer to be applied is produced by condensing particles of a plasma generated by means of a gas discharge which are incident on the substrates.

The invention further relates to an apparatus for carrying out the method.

2. Background of the Invention

The technology of surface treatment and the production of thin films has become extremely significant in recent years, particularly with respect to its industrial application. The numerous known vacuum methods for the production of thin films or for the treatment of material surfaces primarily include methods which relate to vaporization in furnaces, boats, and crucibles, etc. In these methods the vaporization takes place for example through electrical heating, or by electron bombardment by means of an anodic or cathodic arc, or by eddy current heating of conductive material in an induced AC field. Moreover, the large area sputtering of cathodes is known in various embodiments of cathode sputtering, with or without magnetic enhancement of the ionization in the DC or AC glow discharge.

In the known and customary ion assisted vaporization methods the kinetic energies of the atoms, ions and/or particles which are incident on the substrate are distributed such that the highly energetic particles create defects in the crystal lattice of the condensing layer which lead to compressive stresses and embrittlement of the layer, or trigger effects which lead to an undesired reverse sputtering or resputtering of the condensing layer. On the other hand, the incident particles of lower energy often hardly attain the kinetic energy required at the surface to ensure a homogeneous layer build-up. A particularly broad and therefore unfavorable distribution of the kinetic energies of the atoms and ions which are incident on the substrate is present with arc vaporizers in particular. Moreover, macroparticles, termed "droplets", frequently arise with the various forms of arc vaporizers and can be extremely disturbing if a corrosion resistant material coating is required, or if the coefficient of friction of the layer material is intended to be particularly low.

With cathode sputtering, the low concentration of ionized particles compared with arc vaporization is unfavorable, particularly in the direct environment of the substrates to be coated. This frequently leads to the condensing layers not being sufficiently dense, particularly when depositing layers of high melting point such as is the case with hard material coatings.

Moreover, it has been shown that layers deposited by means of cathode sputtering are inferior with respect to bond strength to those deposited by arc vaporization. On the other hand, with cathode sputtering, it is possible to precisely set the kinetic energy of the incident ionized particles in the range of some few electron volts, for example 10 eV up to 1000 eV and more, through a suitable choice of the negative substrate bias, whereas the majority of the non-ionized atoms have a kinetic energy which is typically smaller than 10 eV.

OBJECT OF THE INVENTION

An object of the invention is to develop a method which, on the one hand, ensures the deposition of layers which are as free as possible of defects and which are simultaneously well bonded, i.e. which are of high quality layers, and which, on the other hand, offers adequate possibilities for ideally and precisely matching the layer growth to the required circumstances through a suitable choice of the deposition parameters.

SUMMARY OF THE INVENTION

This object is accomplished in accordance with the invention in that both an arc discharge vaporization process and a cathode sputtering process are performed, with the arc discharge vaporization being carried out before the cathode sputtering; i.e. in the first phase of the coating process, arc vaporization is used and the coating is then continued or terminated by means of cathode sputtering.

As a result of the arc discharge vaporization which precedes the cathode sputtering, a transition layer is generated on the substrate surface with highly energetic ions which ensures a good bond of the layer to be applied on the substrate, whereas, during the subsequent cathode sputtering, it is possible to sensitively control both the speed of condensation at low particle energy over wide ranges, corresponding to the desired crystal growth and the desired crystal structure of the layer to be applied, and also the bias voltage at the substrate. As a result of the short mean free path of the vaporized particles a uniform thickness distribution of the layer arises, even around the corners.

The cathode sputtering can be carried out such that the vapor of the cathode material and also the gas atoms which participate in the cathode sputtering can be ionized to a substantially higher degree in the space between the cathode and the substrate or substrates with the aid of magnetic fields, which are additionally provided as compared with customary known methods of cathode sputtering, such as DC sputtering or magnetron sputtering, whereby a dense layer deposition is made possible. This is achieved by the scattering fields of specially mounted magnetic arrangements, which consist in particular of coils, which can be formed in accordance with the known principles of magnetic field assisted sputtering, and of the imbalanced magnetron (see the literature references 1–6).

As the major portion of the particles which condense on the substrate during arc discharge vaporization is ionized, the kinetic energies can, for example, be advantageously controlled without problem by means of a negative bias on the substrate. With the combination in accordance with the invention of arc discharge vaporization and cathode sputtering, in particular cathode sputtering by means of an imbalanced magnetron, the advantages of the two coating methods, namely the good bond strength and high layer quality which can be achieved, are exploited in an ideal manner without having to tolerate the above described disadvantages of the individual methods.

The substrate is preferably first bombarded during the arc discharge vaporization process with Ti ions of optimized energy and corresponding ion current density such that the substrate surface is cleaned by ion etching, i.e. is partly removed in a known manner. The high ion energy required for this surface cleaning can be generated relatively easily, for example by the application of a negative substrate bias in the range from 1500 V to 2000 V.

The transition zone which is important for the inventive combination of arc discharge vaporization and cathode sputtering is subsequently likewise formed with the aid of arc discharge vaporization in the region directly beneath the substrate surface. For this, the fact is exploited that the multiply ionized Ti-atoms produced during arc discharge vaporization can be implanted into the substrate surface under certain conditions. For this purpose the energy of the Ti-ions must, on the one hand, be sufficiently high, but on the other hand, not too high in order to avoid the above described etching process being initiated. This can be achieved, for example, with substrates of differently alloyed steels, when the negative substrate bias potential lies in the region between 1000 and 1500 V, preferably between 1100 and 1200 V. In the case of iron containing substrates, Ti-Fe mixed crystals then form, by way of example, and ensure a particularly advantageous anchoring of a TiN layer which, for example, grows during coating. Similar favorable results can be achieved if one uses Zr-, Hf-, Cr-, Ta-, Nb or V-ions for the pretreatment in place of Ti-ions. In these cases a zone of, for example, 200 to 400Å thickness and rich in mixed crystals first forms directly beneath the substrate surface, whereas a diffusion profile of the implanted foreign ions occurs beneath it which extends into the substrate thickness to a depth of 1500 to 2000Å. This transition layer then brings about a support function of, for example, the very hard and relatively brittle TiN coating during mechanical loading when the ion energy, for example, of the Ti-vapor, is correspondingly optimized.

The continuation of the coating process can be effected in accordance with two methods:

On the one hand, the negative bias at the substrate can be reduced while retaining the arc discharge vaporization until a majority of the metal atoms and ions arriving at the substrate condense in the presence of nitrogen atoms and ions. This is, for example, the case when the negative substrate bias lies in the range from 10 to 200 V, preferably between 50 and 100 V. The coating is then interrupted when, for example, up to 20% of the desired layer thickness of, for example, TiN has been achieved. The process is then switched over to cathode sputtering.

On the other hand, an even better design of the transition from the substrate to the coating layer can be brought about if one, directly after manufacturing the transition layer by means of arc discharge vaporization, directly switches over the ion implantation to coating by means of cathode sputtering, particularly by using an imbalanced magnetron. In the case of deposition of, for example, TiN, it is advantageous to apply a negative substrate bias voltage during cathode sputtering in the range from 40 V to 200 V, preferably 50±225 V. In doing so it should be ensured that the ion bombardment is carried out with an ion current density greater than 2 mÅ/cm$^2$ in order to attain an adequate layer thickness (see literature reference 7).

The processes of arc discharge vaporization and cathode sputtering can be carried out from the same cathode. It is, however, also possible to use separate or respective cathodes for the two process steps. This leads, on the one hand, to the system concept becoming more expensive but, on the other hand, also opens the possibility of being able to construct the transition layer with materials which differ from the actual coating.

An apparatus for carrying out the method in accordance with the invention includes a chamber which receives the respective working gas, a substrate holder arranged in the chamber, and various electrical circuits which are required to carry out the different method steps. The chamber which is used is in this arrangement is constructed such that it can be pumped out with customary vacuum pumps to $10^{-5}$ mbar. The chamber is electrically grounded.

BRIEF DESCRIPTION OF THE DRAWINGS

The invention will now be explained in the following in more detail with reference to the drawing in which are shown.

DETAILED DESCRIPTION OF THE INVENTION

Figure 1:
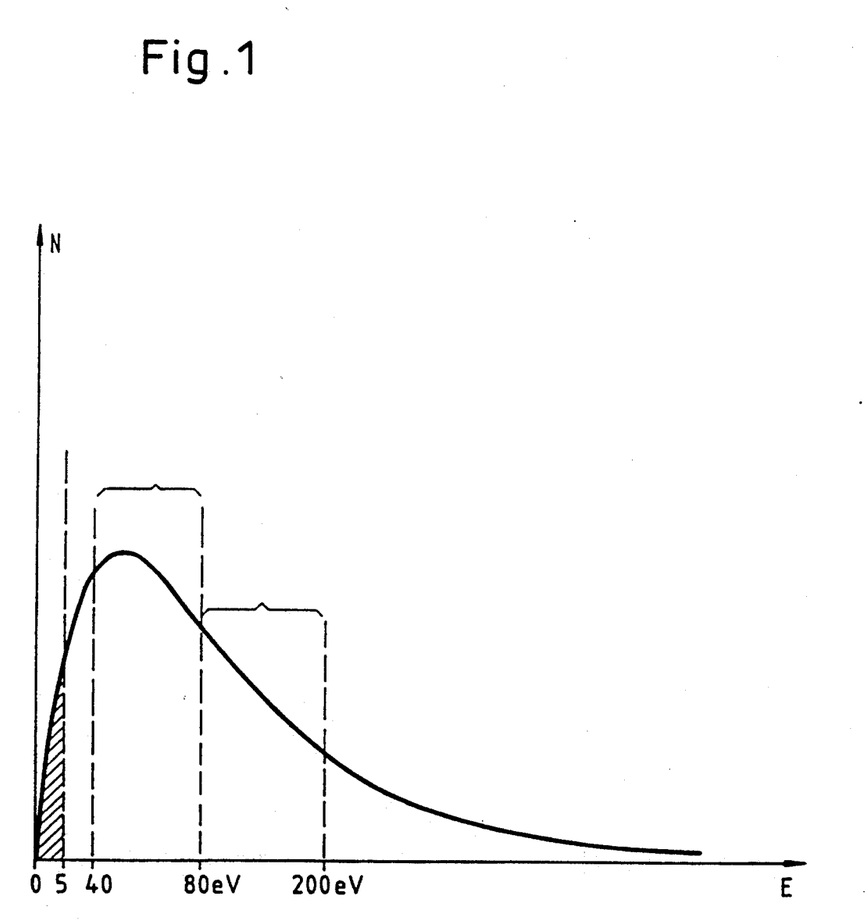
FIG. 1 is a diagram of the typical distribution of the kinetic energies of the particles which are incident on the substrate when coating a substrate by means of a customary arc discharge vaporization method.

The diagram of FIG. 1 shows the typical distribution of the kinetic energies of the particles which are incident on a substrate to be coated by means of a customary arc discharge vaporization method. The kinetic energy is plotted along the abscissa and the frequency of incidence of the condensing particles is plotted along the ordinate.

As can be seen from this diagram, the ideal energy range lies, in accordance with experience, at around 40 to 80 eV. Smaller or larger energies lead to defect mechanisms which are set forth in the diagram.

Figure 2A:
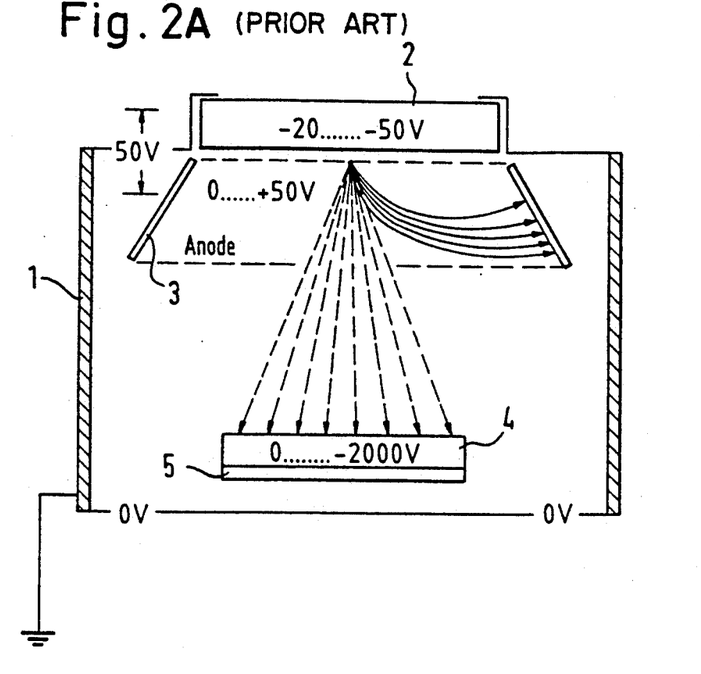
FIGS. 2A and 2B show basic circuit diagrams to explain the arc discharge vaporization and cathode sputtering processes.
Figure 2B:
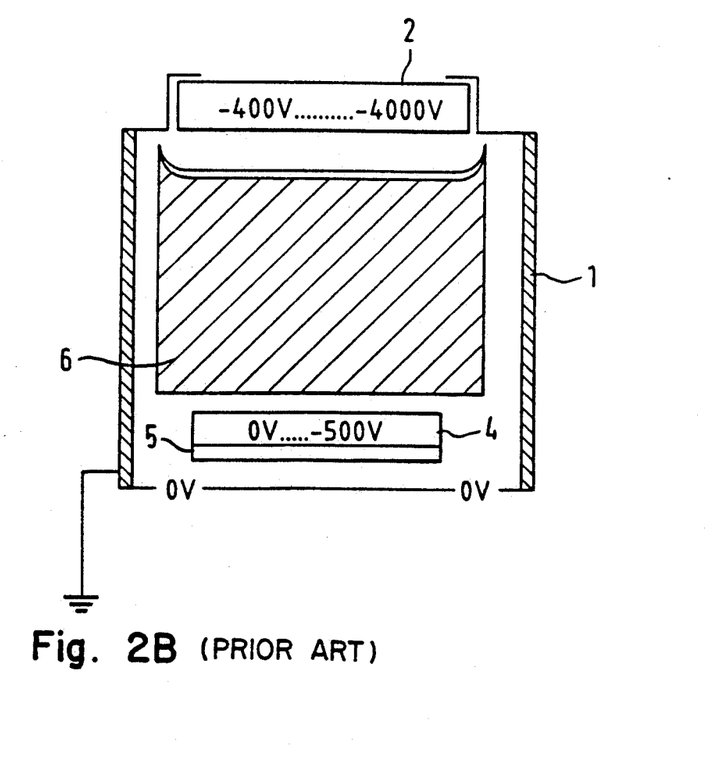

Basic circuit diagrams for arc discharge vaporization and for cathode sputtering are shown in FIGS. 2A and 2B, respectively.

In either case a cathode 2 is arranged in a vacuum chamber 1. In the case of arc discharge vaporization the cathode is held at a potential of −20 V to −50 V. The arc current forms between the cathode 2 and the anode 3.

The anode 3 is at a typical potential in the region between 0 and +50 V. The arc current can amount to several hundreds of amperes. A part of the current propagates in the space in the direction towards the substrates 4. The substrates are maintained, as required, at a negative bias of up to 2000 V in the case of an etching process and, for example, between 1100 and 1200 V in the case of forming the transition layer, or at ca. 100 V during coating.

The substrates 4 are fixedly connected to the substrate holder 5. The latter is positioned inside the chamber 1 in electrically insulated manner and can be connected with a suitable power supply.

In the case of conventional cathode sputtering, the negative bias on the cathode is in the range from 3000 to 4000 V. Typical values for magnetron sputtering lie between 400 and 700 V. The space filling plasma of the conventional cathode sputtering process is schematically indicated with the reference numeral 6. The same conditions apply to the substrates 4 and the substrate holder 5 as in the case of arc discharge vaporization.

Figure 3:
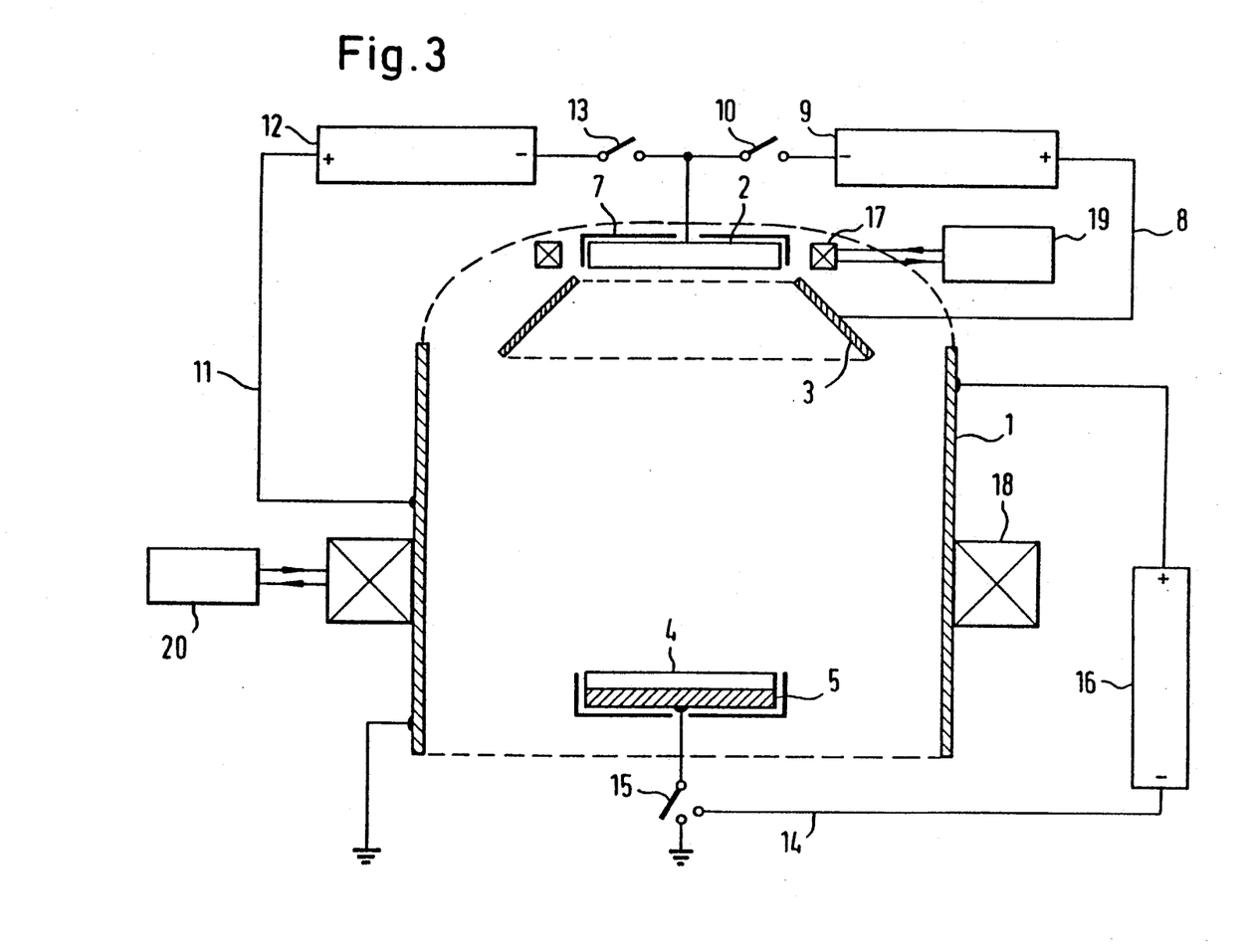
FIG. 3 is a schematic illustration of an apparatus for carrying out the method of the invention.

FIG. 3 shows a block diagram of an example of an apparatus for carrying out the method of the invention. In this arrangement, a common cathode 2 is provided for the arc discharge vaporization and the cathode sputtering.

The cathode 2 is surrounded by a dark field screen 7 held at ground potential or at a floating potential, or insulative material. Cathode 2 and anode 3 are connected together in the circuit 8. The power supply 9 for maintaining the arc discharge and the switch 10 for selectively actuating the arc discharge vaporization are in power circuit 8.

Parallel to the power circuit 8 is the power circuit 11 which connects the power supply 12 to the cathode 2 via the switch 13 for selective maintenance of the cathode sputtering discharge. The positive output of the power supply 12 is, in known manner, at ground potential. Finally, a circuit 14 connects the substrate holder 5 with the negative output of power supply 16 via a switch 15. The positive output in this case is either held at ground potential or at the potential of the chamber. Two possible embodiments of magnetization devices for the plasma (reference numeral 6 in FIG. 2) are indicated by the reference numerals 17 and 18. Depending on the particular apparatus, these magnetization devices 17 and 18 consisting of scattering field coils are electrically connected with DC power supplies 19 and 20, respectively. The level of the coil current is selected such that the ion current density at the substrates 4 is above 2 mÅ/cm² under the action of the negative bias originating from the power supply 16.

Figure 4:
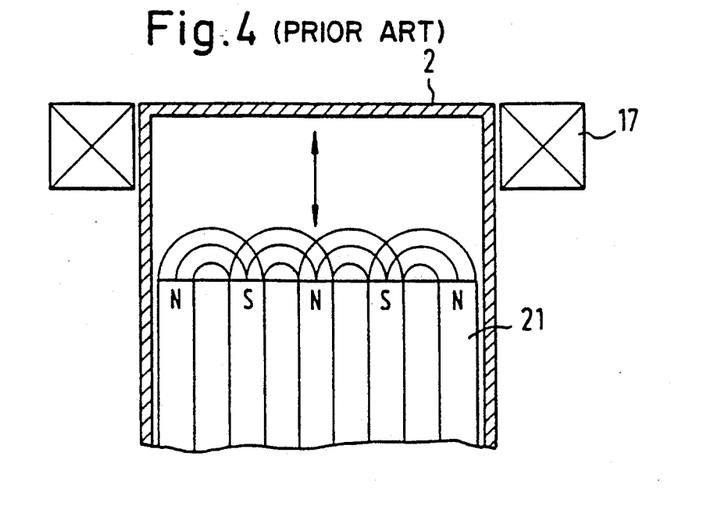
FIG. 4 is a schematic representation of a magnetron cathode.

FIG. 4 shows a known embodiment of a magnetron cathode. Reference numeral 2 designates the target of a conventional or magnetron cathode. Reference numeral 21 designates a special magnet arrangement. A scattering field coil 17 such as shown in FIG. 3 surrounds the arrangement in the region of the target 2. The double arrow indicates that the magnetic field is displaceable relative to the target 2. This is of practical significance because it is of advantage to selectively allow the arc discharge vaporization to proceed on its own with or without the influence of the magnetic field, whereas during cathode sputtering the magnetic field is of importance for the magnetron operation of the cathode.

Figure 5:
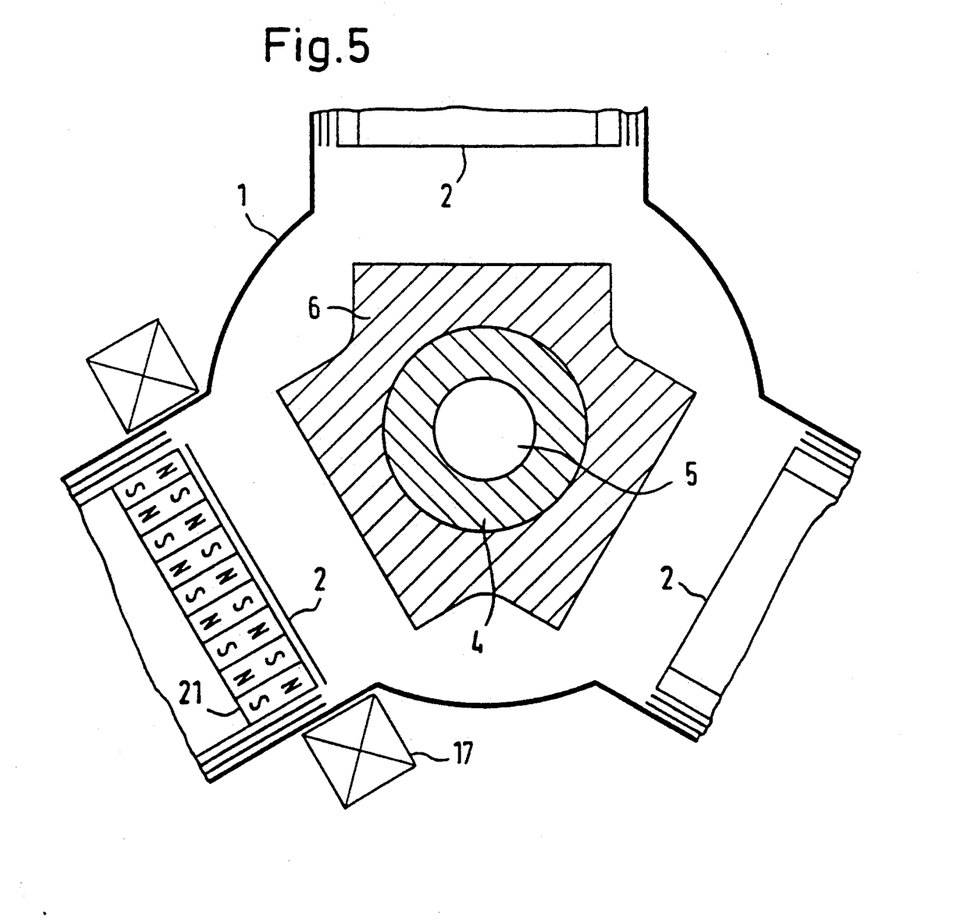
FIG. 5 is a cross-sectional representation of a multi-cathode system.
Figure 6:
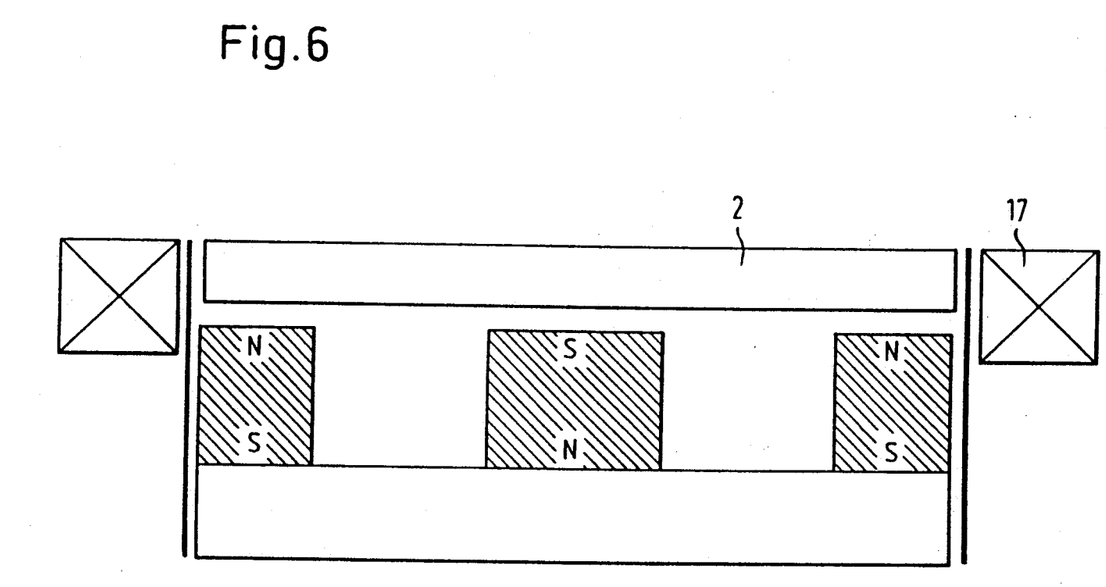
FIG. 6 is a schematic cross-sectional representation of an imbalanced magnetron.

FIG. 5 shows a cross-section of a multi-cathode system. Here two conventional cathodes and the magnetron cathode are located in the chamber 1. One of the conventional cathodes can in this case be used as an arc discharge vaporizer, whereas the other serves as a sputtering source. Finally, FIG. 6 shows the shape most frequently represented in the relevant literature for a magnetron in cross-section. In this arrangement the coil 17 again serves to increase the ionization of the space and acts in conjunction with the magnet arrangement consisting of permanent magnets, preferably of SmCo or NdFeB, as an imbalanced magnetron.

Figure 7:
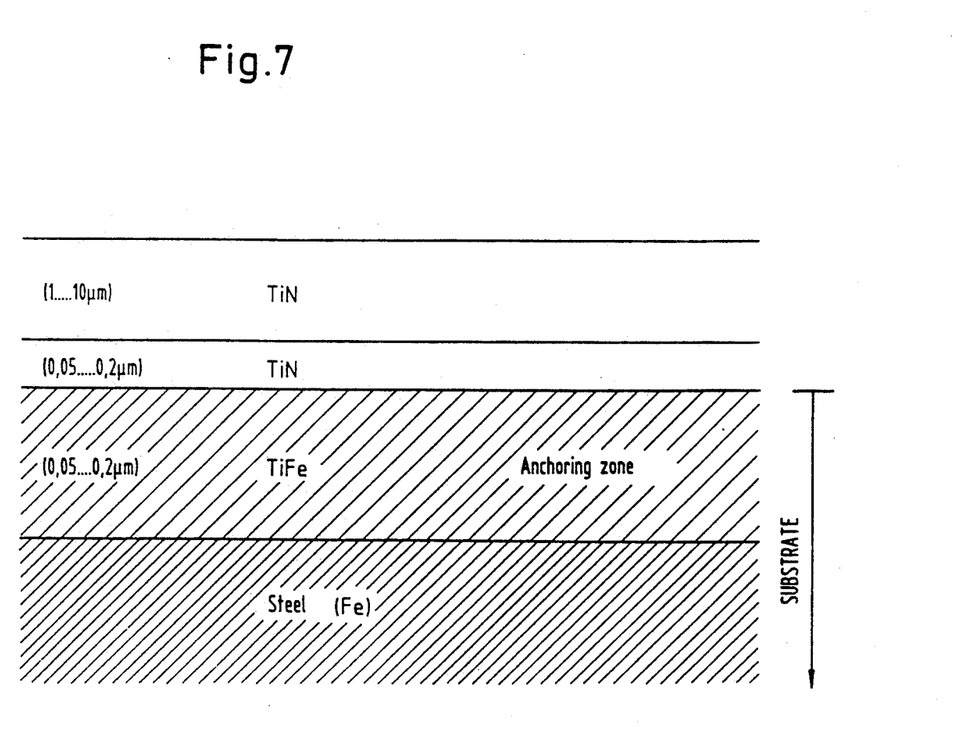
FIGS. 7 and 8 show an example of a layer build-up and of the associated process steps in a schematic illustration.
Figure 8:
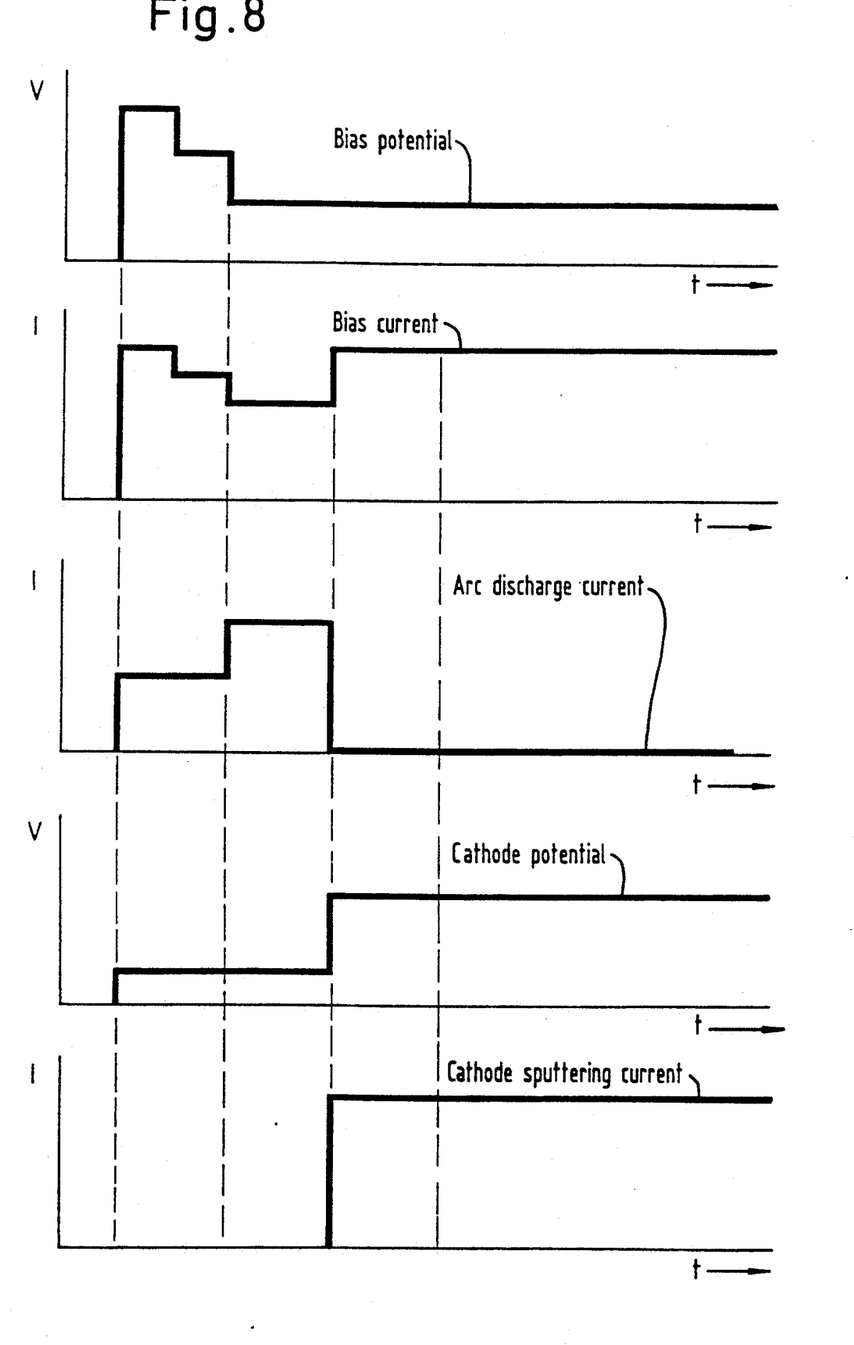

FIGS. 7 and 8 schematically show the various coating layers and the individual process steps.

FIG. 7 shows a typical substrate of steel, the surface of which is characterized by the transition layer which quasi operates as an "anchoring zone". When using Ti as a coating material, intermetallic phases arise in this region, consisting, for example, of TiFe. A first layer of TiN then lies on this transition zone and is formed through reactive vapor deposition by means of arc discharge vaporization. This layer is then followed by a second TiN layer deposited by cathode sputtering.

FIG. 8 shows the time sequence of the characteristic electrical method parameters in a schematic representation.

During the etching process, the bias potential applied to the substrate is at its highest value (typically $-1600$ V) and is reduced stepwise to form the transition zone (typically $-1100$ V) and during coating with the aid of the power supply 16. The current at the substrates is initially very high and is reduced during the formation of the transition layer.

During the coating by means of arc discharge vaporization, and also during the phase of cathode sputtering, the negative substrate bias can be held at a constant level, i.e. typically 50 V±25 V.

To achieve an adequate ion current at the substrate the arc current (power supply 9) is increased.

The cathode potential is held almost constant (typically $-20$ V) during the first process steps by means of the power supply 9 and is increased by means of the power supply 12 to typically $-500$ V during the coating by cathode sputtering, for example when using magnetron cathodes.

The cathode current during cathode sputtering is current controlled by means of power supply 12 and remains constant during the course of the further coating process.

The ion current to the substrates (bias current) is correspondingly high through the use of additional magnetic ionization (for example, by means of the magnetizing devices 17, 18) and is greater than 2 mÅ/cm².

Figure 9:
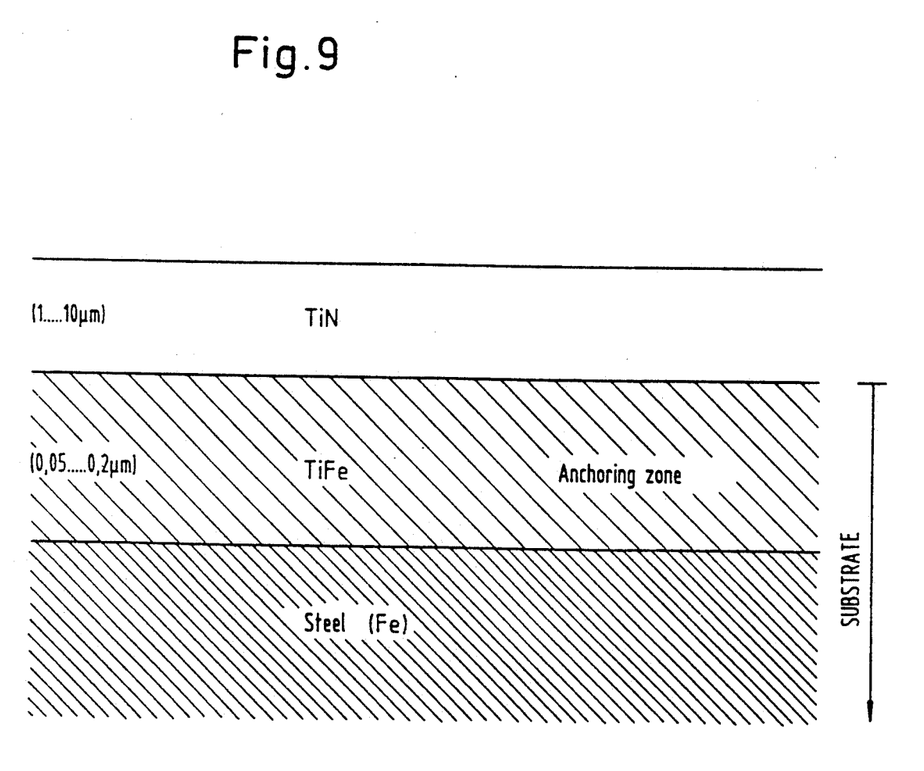
FIGS. 9 and 10 depict a schematic representation of a preferred layer sequence and the temporal course or time sequence of the associated process steps.
Figure 10:
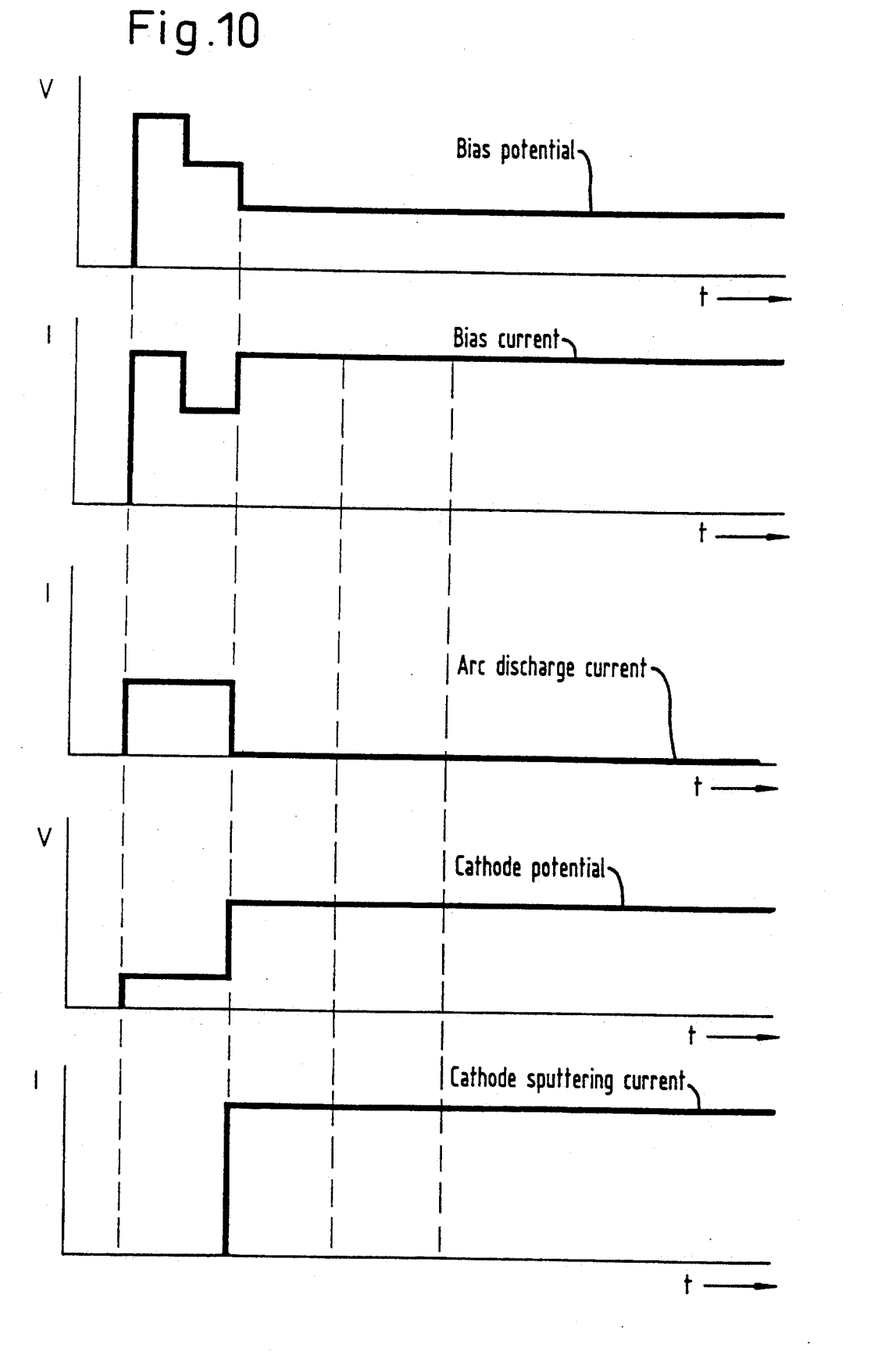

FIGS. 9 and 10 represent a preferred method with reference to the example of TiN coating.

FIG. 9 shows the layer sequence. The TiN-layer lies directly above the "anchoring zone".

FIG. 10 shows the time sequence of the process steps. In comparison to FIG. 8, the phase of arc discharge vaporization for the production of a first TiN-layer is missing.

The most important process parameters for the method of the invention are set forth in the following table:

TABLE

| Process step | Process parameter | Unit | Operational range | Preferred range |
| --- | --- | --- | --- | --- |
| Etching | Arc potential | V | 15-50 | 20-40 |
| | Arc current | A | 40-400 | 50-250 |
| | Pressure | $10^{-5}$ mbar | 0.1-2 | 0.5-1 |
| | Neg. substrate bias | V | 1300-2000 | 1500-1600 |
| | Etching time | min | 1-10 | 2-5 |
| Transition zone | Arc potential | V | 15-50 | 20-40 |

TABLE-continued

| Process step | Process parameter | Process parameters Unit | Operational range | Preferred range |
| --- | --- | --- | --- | --- |
| (Ion implant- | Arc current | A | 40–400 | 50–250 |
| ation) | Pressure | $10^{-5}$ mbar | 0.1–2 | 0.5–1 |
|  | Neg. substrate bias | V | 1000–1500 | 1000–1200 |
|  | Implantation time | min | 1–20 | 5–10 |
| Coating | Discharge potential | V | 300–750 | 500–600 |
| (imbalanced | Discharge power | W/cm$^2$ | 5–30 | 10–15 |
| magnetron) | Total pressure | $10^{-3}$ mbar | 0.5–50 | 1–3 |
|  | Neg. substrate bias | V | 0–500 | 50 ± 25 |
|  | Bias current density | mA/cm$^2$ | 1–10 | 2–4 |
|  | Rate | nm/sec | 0.5–10 | 1–1.5 |
|  | Layer thickness | μm | 1–10 | 3–5 |
|  | Substrate temperature | °C. | 250–600 | 350–450 |

LITERATURE:

1. L. Maissel, "Handbook of Thin Film Technology" McGraw-Hill Book Company, 1970, p. 4.8
2. T. Hata, R. Noda, O. Morimoto, T. Hada *Appl. Phys. Lett.*, 37 (3) 1980, p. 633
3. B. Window, F. Sharples, N. Savvides *Vac. Sci. Technol.*, A 3 (6) 1985, p. 2368
4. B. Window, N. Savvides *Vac. Sci. Technol.*, A 4 (2) 1986, p. 196
5. B. Window, N. Savvides *Vac. Sci. Technol.*, A 4 (3) 1985, p. 453
6. S. Kadlec, V. Musil, W.-D. Manz, G. Hakanssot E. Sundgren, 16th ICMC, San Diego, U.S.A., 1989
7. H. Freller, H. P. Lorenz *Vac. Sci. Technol.*, A 4 (1986), p. 2691
8. H. Freller Proc. SURTEC, Berlin '89, Carl Hanser Verlag, Munich, 133

We claim:

1. A method for the coating of a substrate in which a layer to be applied is produced by condensing particles of a plasma generated by means of a gas discharge which are incident on the substrate, the method comprising an arc discharge vaporization coating process and a cathode sputtering coating process, the arc discharge vaporization coating process being carried out before the cathode sputtering coating process; the arc discharge vaporization coating process being carried out with an ion energy and ion flux density which is selected to produce an anchorizing zone in the substrate for the layer by bombarding the substrate with appropriately optimized ion energy and ion current density in such a way that ion implantation takes place in which ions penetrate into the substrate to a depth of a plurality of crystal lattice planes to thereby form the anchoring zone.

2. Method in accordance with claim 1 including initially directing during arc discharge vaporization ions of sufficiently high energy and ion current density against a surface of the substrate such that the substrate surface is cleaned and partially removed by ion etching.

3. Method in accordance with claim 2 wherein the step of initially directing takes place by means of ions of an inert gas or metal ions originating from the cathode or from a mixture of the same.

4. Method in accordance with claim 1 wherein the step of bombarding the substrate takes place with metal ions.

5. Method in accordance with claim 1 including using titanium ions to form the anchoring zone.

6. Method in accordance with claim 1, including selecting the parameters during arc discharge vaporization to lead to the deposition of the layer, terminating the arc discharge vaporization, and following it by cathodic sputtering until the desired layer thickness is reached.

7. Method in accordance with claim 6, including limiting the layer component thickness produced by arc discharge to up to approximately 20% of the total layer thickness.

8. A method according to claim 6 wherein the layer comprises a TiN layer.

9. Method in accordance with claim 1, wherein immediately following the formation of the anchoring zone a coating is directly effected by means of cathode.

10. Method in accordance with claim 1, including producing a boundary bonding layer by directing an electric field onto the substrate, slowly and continuously weakening the electric field by reducing a corresponding electric bias potential; and, after extinguishing the arc, continuously increasing the cathode sputtering.

11. Method in accordance with claim 1, including using the same cathode for the arc discharge vaporization process and for the cathode sputtering process.

12. Method in accordance with claim 1, including using separate cathodes for the arc discharge vaporization process and the cathode sputtering process, respectively.

13. Method in accordance with claim 1, including operating the sputtering cathode as an imbalanced magnetron.

14. Method in accordance with claim 13, wherein the imbalanced magnetron includes a concentric external magnetic coil.

15. Method in accordance with claim 1, including controlling the energy of the ions impinging onto the substrate during coating by choosing a negative bias potential on the substrate in the range of 50±25 V.

16. Method in accordance with claim 15, including setting the bias current density flowing to said substrate at a value larger than 2 mA/cm$^2$ with the aid of the arc current density and the bias voltage during coating by means of arc discharge, and with the aid of a magnetic coil associated with the cathode during cathode sputtering.

17. Method in accordance with claim 1, including continuously transforming the arc discharge vaporization process into the cathode sputtering process in such a way that deposits from the two processes become superimposed during the transition.

18. Method in accordance with claim 1, including depositing a mixed layer following the formation of said anchoring layer, the mixed layer being formed by means of simultaneous arc vaporization and cathode sputtering.

19. A method for applying a material layer to a surface of a substrate in a processing gas environment, the method comprising the steps of initially bombarding the surface of the substrate with ions of an energy and current density selected to implant the ions in the substrate to a depth of a plurality of crystal lattice planes, thereby forming an anchoring zone for the material layer; thereafter applying a first portion of the material layer over the anchoring zone with an arc discharge vaporization coating process; and thereafter forming a second portion of the material layer over the first portion with a cathode sputtering coating process.

20. A method according to claim 19 wherein the step of bombarding forms an initial phase of the arc discharge vaporization coating process.

21. A method according to claim 20 including the step of etching the substrate surface prior to the bombarding step, the etching step comprising the step of subjecting the substrate to a negative bias of between 1500 V to 2000 V during a beginning phase of the arc discharge vaporization coating process.

22. A method according to claim 19 including the step of subjecting the substrate to a bias potential of between 1000 V and 1500 V during the bombarding step.

23. A method according to claim 22 including the step of maintaining the substrate at a bias potential of between 1100 and 1200 V during the bombarding step.

24. A method according to claim 19 wherein the step of bombarding includes the step of bombarding the substrate surface with ions selected from the group of materials consisting of Ti, Zr, Hf, Cr, Ta, Nb, and V.

25. A method according to claim 19 wherein the step of bombarding comprises the step of bombarding the substrate surface with Ti ions.

26. A method according to claim 19 wherein the step of bombarding comprises the step of bombarding the substrate surface with ions of sufficient energy and current density and for sufficient length of time to penetrate the substrate with the ions sufficiently to form an anchoring zone comprising mixed crystals to a depth of 200 to 400Å beneath the substrate surface.

27. A method for the coating of a substrate in which a layer to be applied is produced by condensing particles of a plasma generated by means of a gas discharge which are incident on the substrate, the method comprising: an arc discharge vaporization coating process and a cathode sputtering coating process, the arc discharge vaporization coating process being carried out before the cathode sputtering coating process; and producing a boundary bonding layer by directing an electric field onto the substrate, slowly and continuously weakening the electric field by reducing a corresponding electric bias potential, and, after terminating the arc discharge vaporization coating process, continuously increasing the cathode sputtering coating process.

28. Apparatus for applying and intimately attaching a material layer to a substrate comprising: a vacuum chamber adapted to be filled with a processing gas; a substrate holder electrically insulated from and disposed within the chamber; a cathode electrically insulated from and disposed inside the chamber, the cathode being provided with material for the layer; an anode; an arc discharge first power supply; a cathode sputtering second power supply; a first electric circuit operatively coupled the cathode, the anode and the first power supply; a second electric circuit operatively coupling the cathode, the substrate holder and the second power supply; means for selectively and sequentially opening and closing the electric circuits in such a way than an arc discharge vaporization coating process is carried out first and is followed by a cathode sputtering coating process to form said layer on the substrate; and means for generating an ion flow having an energy and current density during an initial phase of the arc discharge vaporization coating process to penetrate ions into the substrate to a depth of a plurality of crystal lattice planes to form an anchoring zone for an enhanced attachment for said material layer to the substrate.

* * * * *